(12) United States Patent
Bouche

(10) Patent No.: US 8,164,183 B2
(45) Date of Patent: Apr. 24, 2012

(54) INTEGRATED CIRCUIT COOLING DEVICE

(75) Inventor: Guillaume Bouche, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 229 days.

(21) Appl. No.: 10/580,324

(22) PCT Filed: Nov. 12, 2004

(86) PCT No.: PCT/FR2004/050584
§ 371 (c)(1),
(2), (4) Date: May 18, 2007

(87) PCT Pub. No.: WO2005/052371
PCT Pub. Date: Jun. 9, 2005

(65) Prior Publication Data
US 2007/0278663 A1  Dec. 6, 2007

(30) Foreign Application Priority Data
Nov. 25, 2003 (FR) ...................... 03 50910

(51) Int. Cl.
*H01L 23/34* (2006.01)
(52) U.S. Cl. .................. 257/714; 257/E23.08
(58) Field of Classification Search .......... 257/706, 257/E21.495, E23.08, 712, 714, 705; 417/53
See application file for complete search history.

(56) References Cited

U.S. PATENT DOCUMENTS

| | | | |
|---|---|---|---|
| 5,367,878 A | 11/1994 | Muntz et al. | |
| 5,705,018 A | 1/1998 | Hartley | |
| 5,901,037 A * | 5/1999 | Hamilton et al. | 361/699 |
| 6,007,309 A | 12/1999 | Hartley | |
| 6,032,923 A | 3/2000 | Biegelsen et al. | |
| 6,106,245 A | 8/2000 | Cabuz | |
| 6,767,190 B2 * | 7/2004 | Cabuz et al. | 417/53 |
| 6,837,476 B2 * | 1/2005 | Cabuz et al. | 251/129.01 |
| 2003/0116813 A1 * | 6/2003 | Benzel et al. | 257/414 |

OTHER PUBLICATIONS

C. Cabuz et al., "The Double Diaphragm Pump," The 14th IEEE International Micro Electro Mechanical Systems conference, MEMS'01, Jan. 21-23, Interlachen, Switzerland.*
Internationale Search Report from corresponding International Application No. PCT/FR2004/050584, filed Nov. 12, 2004.

* cited by examiner

*Primary Examiner* — Evan Pert
*Assistant Examiner* — Selim Ahmed
(74) *Attorney, Agent, or Firm* — Wolf, Greenfield & Sacks, P.C.

(57) ABSTRACT

A pump having: a cavity formed inside an insulating substrate, the upper part of the substrate being situated near the cavity having an edge; a conductive layer covering the inside of the cavity up to the edge and optionally covering the edge itself; a flexible membrane made of a conductive material placed above the cavity and resting against the edge; a dielectric layer covering the conductive layer or the membrane whereby insulating the portions of the conductive layer and of the membrane that are near one another; at least one aeration line formed in the insulating substrate that opens into the cavity via an opening in the conductive layer, and; terminals for applying a voltage between the conductive layer and the membrane.

22 Claims, 5 Drawing Sheets

INTEGRATED CIRCUIT COOLING DEVICE

BACKGROUND OF THE INVENTION

1. Field of the Invention

The present invention relates to micropumps and in particular to their use in an integrated circuit cooling device.

2. Discussion of the Related Art

A known cooling device is a metal heat sink placed against a surface of an integrated circuit chip. The carrying off of the heat from a "hot" area of the circuit to the heat sink is performed through a portion of the circuit generally exhibiting poor thermal conductivity.

As a complement to such a heat sink, or if no other cooling device is present, the integrated circuit is placed in an enclosure comprising a blower generating a permanent air current around the circuit.

These two cooling devices, associated or not, may not provide sufficient cooling down of a circuit having a high active density of components.

An object of the present invention is to provide a cooling device capable of maintaining at an acceptable level the temperature of an integrated circuit comprising a large number of active components.

A more general object of the present invention is to provide a micropump.

To achieve this, the present invention provides a pump comprising: a cavity formed in an insulating substrate, the upper portion of the substrate located in the vicinity of the cavity forming a border, a conductive layer covering the inside of the cavity all the way to the border and possibly covering the border, a flexible membrane, formed of a conductive material, placed above the cavity and bearing against the border, a dielectric layer covering the conductive layer or the membrane to insulate the portions of the conductive layer and of the membrane which are close to each other, at least one ventilating duct formed in the insulating substrate which emerges into the cavity through an opening of the conductive layer, and terminals of application of a voltage between the conductive layer and the membrane.

According to an embodiment of the above-mentioned pump, said cavity has substantially the shape of a cup such that the interval between the conductive layer and the membrane progressively increases from the border to the bottom of the cavity.

According to an embodiment of the above-mentioned pump, the membrane is in an idle state when no voltage is applied between said terminals, the application of a voltage deforming the membrane by drawing it closer to the conductive layer, the removal of the voltage bringing the membrane back to its idle state.

According to an embodiment of the above-mentioned pump, the pump comprises a single ventilating duct emerging substantially at the bottom of the cavity.

According to an embodiment of the above-mentioned pump, the pump comprises two ventilating ducts, one emerging substantially at the bottom of the cavity, the other one emerging close to the border.

According to an embodiment of the above-mentioned pump, the pump is connected to an assembly of ventilating ducts formed in the semiconductor substrate of the integrated circuit.

The present invention also provides a method for forming a pump in an integrated circuit, comprising the steps of: forming a cavity in an insulating substrate, the upper portion of the substrate located in the vicinity of the cavity forming a border; covering the inside of the cavity all the way to the border and possibly the border with a first conductive layer; forming an opening of the conductive layer emerging into a ventilating duct previously formed in the insulating substrate; filling the cavity with a sacrificial portion; covering the sacrificial portion and the portion of the first conductive layer placed above the border with a first insulating layer and with a second insulating layer; forming a small opening in the second conductive layer and in the first insulating layer; removing the sacrificial portion; and covering the second conductive layer with a second insulating layer to close back the opening.

According to an embodiment of the present invention, the step of forming a cavity in an insulating substrate comprises the steps of: forming insulating pads on a first insulating layer; covering the first insulating layer and the insulating pads with a second insulating layer; and performing a chem.-mech. polishing of the second insulating layer to expose the insulating pads, the etch method of the polishing being such that it etches the second insulating layer more than the insulating pads, the insulating pads forming said border.

The present invention also provides a method for actuating a pump such as described hereabove, in which a voltage is applied at regular or irregular intervals between said terminals.

The foregoing object, features, and advantages of the present invention will be discussed in detail in the following non-limiting description of specific embodiments in connection with the accompanying drawings, in which:

DETAILED DESCRIPTION

As usual in the representation of integrated circuits, the various drawings are not to scale.

1. Pump

Figure 1:
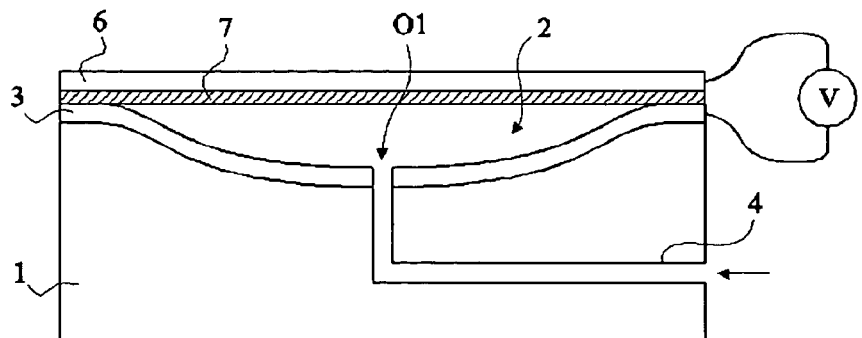
FIGS. 1 and 2 are cross-section views of a pump according to the present invention in two operating states.
Figure 2:
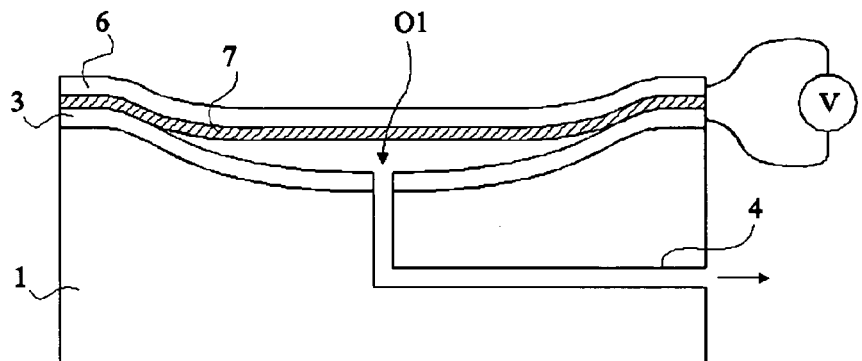
Figure 3:
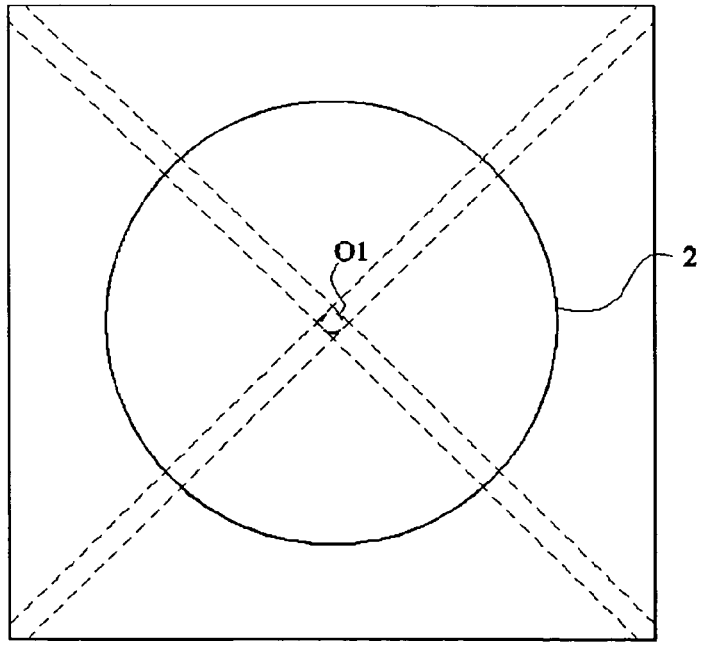
FIG. 3 is a top view of the pump shown in FIGS. 1 and 2.

FIGS. 1 and 2 are cross-section views of a pump according to the present invention respectively in an idle state and in an activation state. FIG. 3 is a top view of the pump shown in FIGS. 1 and 2. The pump is formed above an insulating substrate 1 and more specifically in an upper cavity 2 of substrate 1. Cavity 2 has in this example the shape of a cup. The upper portion of substrate 1 located in the vicinity of the cavity forms a border, having in this example a circular shape such as visible in FIG. 3. The inside and the border of cavity 2 are covered with a conductive layer 3, for example, made of copper or of aluminum. An opening O1 of conductive layer 3 is formed substantially at the bottom of cavity 2 above a ventilating duct 4 formed in substrate 1. Ventilating duct 4 emerges outside of the substrate. A flexible membrane 6, formed of a conductive material, is placed above cavity 2 and bears against the border of cavity 2 above conductive layer 3. Membrane 6 and conductive layer 3 are insulated from each other by an insulating layer 7 covering in this example the lower surface of flexible membrane 6. Conductive layer 3 and flexible membrane 6 are connected to two terminals between which a control circuit V applies a voltage when ordered to do so.

In the idle state, when control circuit V applies no voltage, membrane 6 and insulating layer 7 are substantially horizontal, as shown in FIG. 1. In the activation state, when control circuit V applies a voltage, membrane 6 deforms by coming closer to conductive layer 3, as shown in FIG. 2. When membrane 6 deforms, the volume of the air pocket located between membrane 6 and conductive layer 3 decreases, which results in chasing the air towards ventilating duct 4. When control circuit V stops applying a voltage, membrane 6 separates from conductive layer 3 to return to its idle state horizontal position. The volume of the air pocket then progressively increases, which results in letting air into ventilating duct 4. By successively repeating the operations of deformation and release of membrane 6, it is thus possible to alternately let in "fresh" air and let out "hot" air.

According to an alternative embodiment of the above-described pump, insulating layer 7 covers conductive layer 3. Opening O1 is then formed through insulating layer 7 and conductive layer 3.

Figure 4:
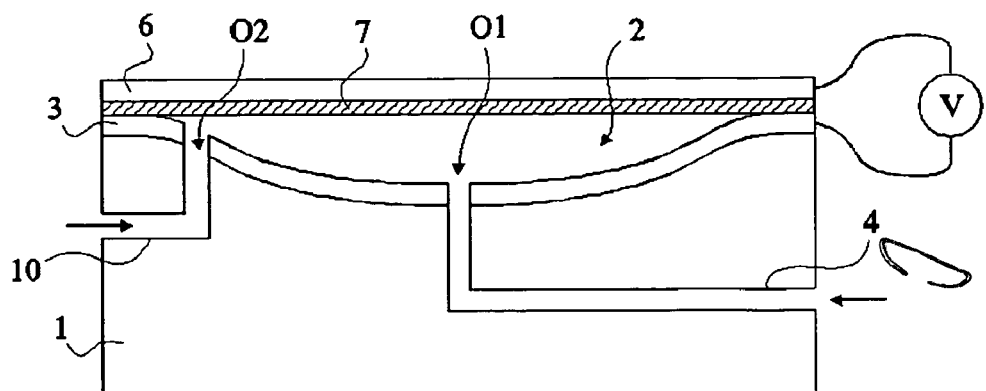
FIGS. 4 and 5 are cross-section views of another example of a pump according to the present invention in two operating states.
Figure 5:
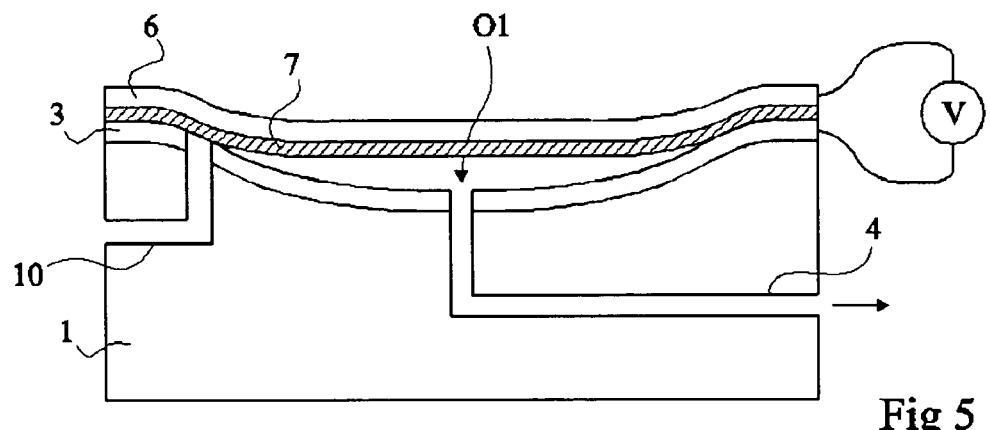

FIGS. 4 and 5 are cross-section views of another example of a pump according to the present invention respectively in an idle state and in an activation state. The pump has a structure substantially identical to that of the pump shown in FIGS. 1 to 3. The pump further comprises a second ventilating duct 10 connected to a second opening of the substrate and emerging into a second opening O2 of conductive layer 3 formed close to the border of cup-shaped cavity 2.

When control circuit V applies a voltage, membrane 6 progressively deforms and by coming closer to conductive layer 3, it covers opening O2. Then, the increasing deformation of the membrane reduces the air pocket volume and chases hot air out of ventilating duct 4. When control circuit V stops applying a voltage, membrane 6 progressively relaxes to return to its idle state. As long as membrane 6 covers opening O2, air enters the cavity through ventilating duct 4. As soon as opening O2 is uncovered, air enters cavity 2 through the two ventilating ducts 4 and 10.

In the case where the size of opening O2 is much larger than that of opening O1, the air volume entering through opening O2 is much larger than that entering through opening O1. Thus, upon relaxation of membrane 6, it is possible to fill cavity 2 with air principally coming from ventilating duct 10. Accordingly, the coming in of "fresh" air into cavity 2 mainly occurs through ventilating duct 10 and the coming out of "hot" air mainly occurs through ventilating duct 4.

As an example, the sizes of the various pump elements are the following:
diameter of the cup-shaped cavity: from 100 to 1000 µm
maximum depth of the cavity (at the center): 15 µm
diameter of ventilating duct 4 (opening O1): from 1 to 10 µm
diameter of ventilating duct 10: from 1 to 10 µm
thickness of conductive layer 3: from 100 nm to 2 µm
thickness of membrane 6: 2 µm When the control circuit applies a voltage between layer 3 and membrane 6, the deformation of membrane 6 is progressive. The portions of layer 3 and of membrane 6 located in the vicinity of the border of cavity 2 are close to each other and a small voltage enables drawing them closer. Once these first portions have been drawn closer to each other, the portions of layer 3 and of membrane 6 located right next to them are then close to each other and a small voltage enables drawing them closer, and so on. The maximum deformation is that for which the "mechanical" membrane restoring force becomes equal to the electrostatic force created between layer 3 and membrane 6 by application of a voltage by control circuit V.

An advantage of the above-described pumps is that they can be activated with a small voltage.

The above-described pumps have a cup shape, which has the above-mentioned advantage. However, other cavity shapes may be imagined in which the conductive layer placed inside of the cavity and the flexible membrane placed above the cavity are not necessarily in contact on the cavity border.

2. Pump Manufacturing Method

A pump according to the present invention can be formed according to the method described hereafter.

Figure 6A:
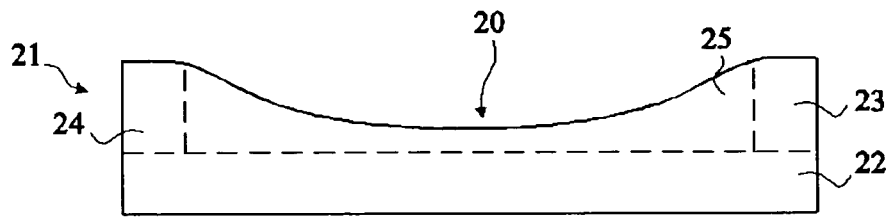
FIGS. 6A to 6I are cross-section views of structures obtained in successive steps of a method for forming a pump according to the present invention.

In an initial step, illustrated in FIG. 6A, a cup-shaped cavity 20 is formed in an insulating substrate 21. The upper part of the substrate located close to the cavity forms a border. The cavity will preferably be "cup"-shaped so that the cavity depth progressively increases from the border to the bottom of the cavity.

The cup shape can be obtained according to the following method. Insulating pads 23 and 24 are formed on an insulating layer 22. Insulating layer 22 and possibly pads 23 and 24 are then covered with a second insulating layer 25. A chem.-mech. polishing of second insulating layer 25 is then performed to expose insulating pads 23 and 24. The etch method implemented in the polishing is selected to that it "etches" insulating layer 25 more than pads 23 and 24. When pads 23 and 24 are relatively spaced apart, a recess forms in insulating layer 25 between pads 23 and 24. This phenomenon, known as "dishing", is generally not desirable since it results in the forming of non-planar surfaces. However, advantage is taken of this phenomenon in the method of the present invention to form a cup-shaped cavity.

Figure 6B:
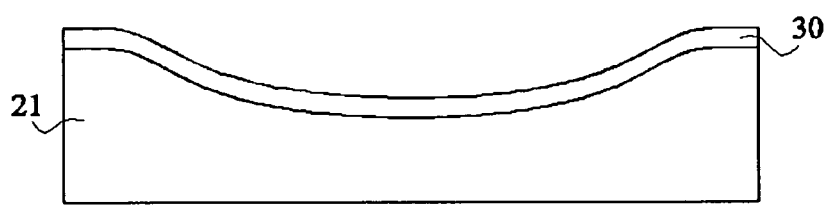

At the next step, illustrated in FIG. 6B, the inside and the border of cavity 20 are covered with a conductive layer 30, for example, made of aluminum.

Figure 6C:
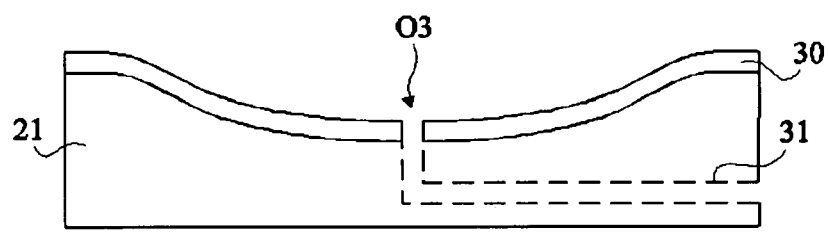

At the next step, illustrated in FIG. 6C, conductive layer 30 is etched to form an opening O3 at the bottom of cavity 20 above a ventilating duct 31 previously formed in substrate 21.

Figure 6D:
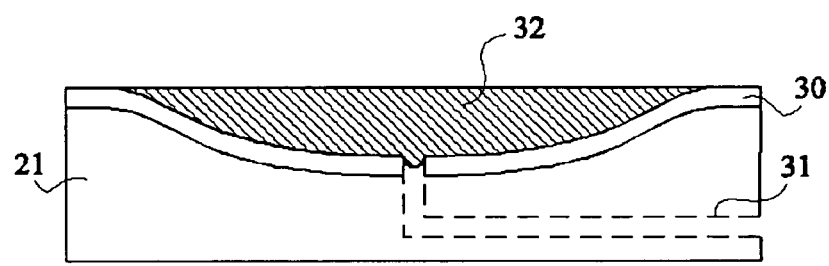

At the next step, illustrated in FIG. 6D, cavity 20 is filled with a sacrificial portion 32. Sacrificial portion 32 does not cover the border of cavity 20. A method of sacrificial layer deposition which conforms as little as possible may be used to avoid filling ventilating duct 31. An etch or a chem.-mech. polishing of the sacrificial layer is then performed to remove the portions covering the border of cavity 20.

Figure 6E:
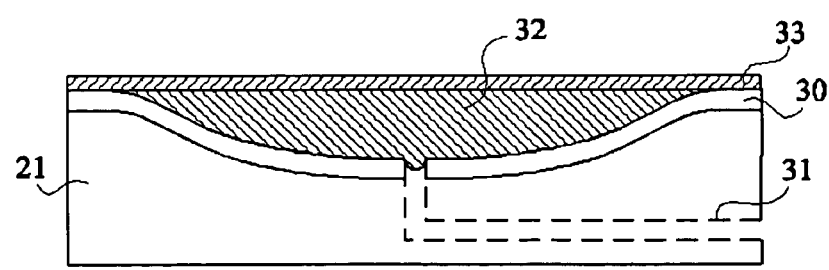

At the next step, illustrated in FIG. 6E, an insulating layer 33 is formed above sacrificial portion 32 and above the portions of conductive layer 30 located on the border of cavity 20.

Figure 6F:
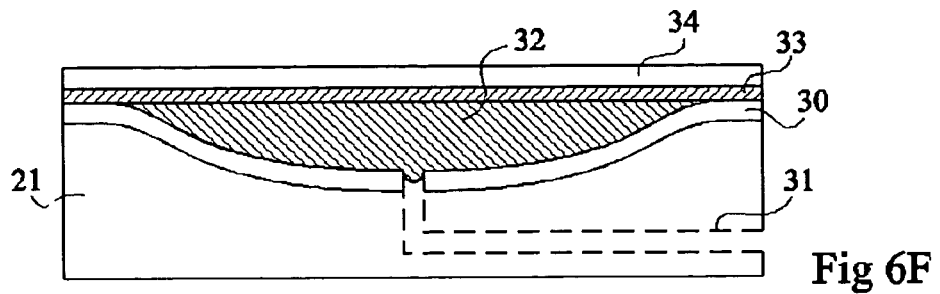

At the next step, illustrated in FIG. 6F, insulating layer 33 is covered with a conductive layer 34.

Figure 6G:
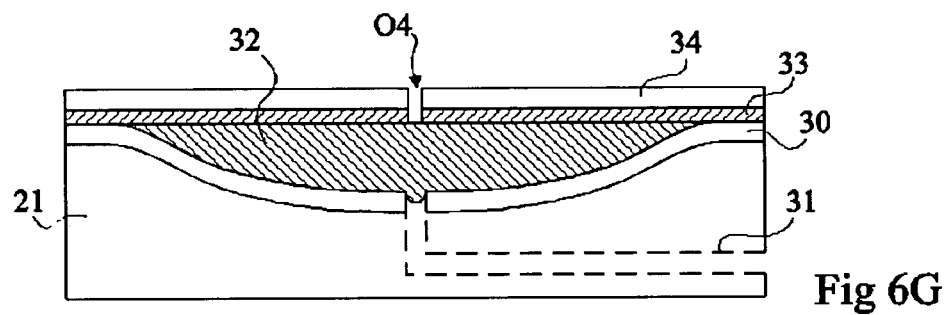

At the next step, illustrated in FIG. 6G, a small opening O4 is formed in conductive layer 34 and in insulating layer 33 to reach underlying sacrificial portion 32.

Figure 6H:
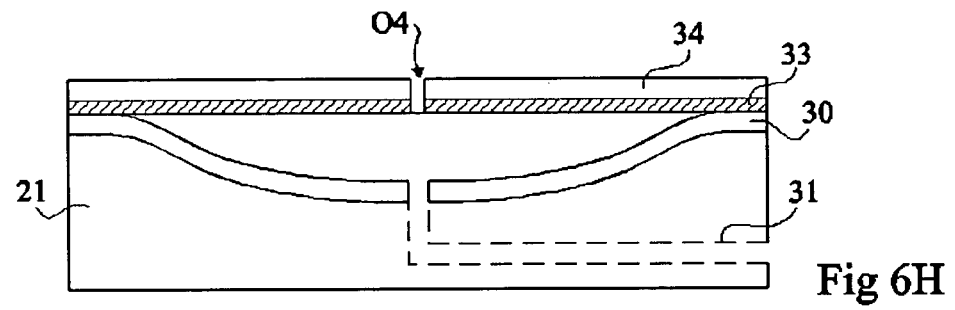

At the next step, illustrated in FIG. 6H, sacrificial portion 32 is removed through opening O4, for example, by etching.

Figure 6I:
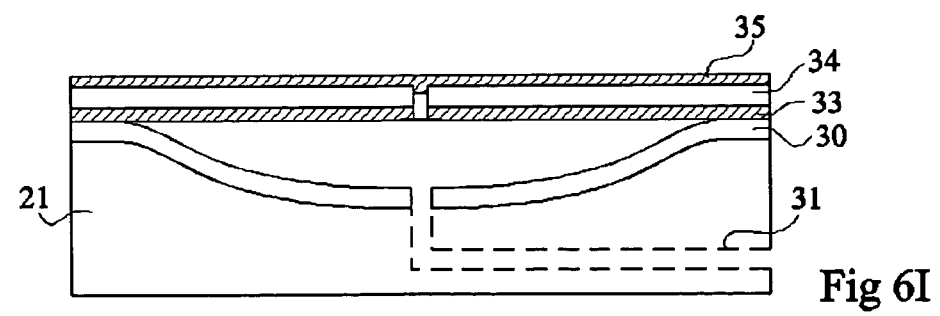

At the next step, illustrated in FIG. 6I, conductive layer 34 is covered with a thin insulating layer 35 according to a method which is as little conformal as possible so that the deposited insulating layer penetrates as little as possible through opening O4.

3. Pump Placed in an Integrated Circuit

A pump according to the present invention may be used to have air or another fluid flow through an assembly of ventilating ducts formed in an integrated circuit to cool it down. An example of ventilating ducts and a method for forming such ventilating ducts are described in "Micromachining of Buried Micro Channels in Silicon", JOURNAL OF MICROELECTROMECHANICAL SYSTEMS, Vol. 9, N°1, March 2000, which is incorporated herein by reference.

Figure 7:
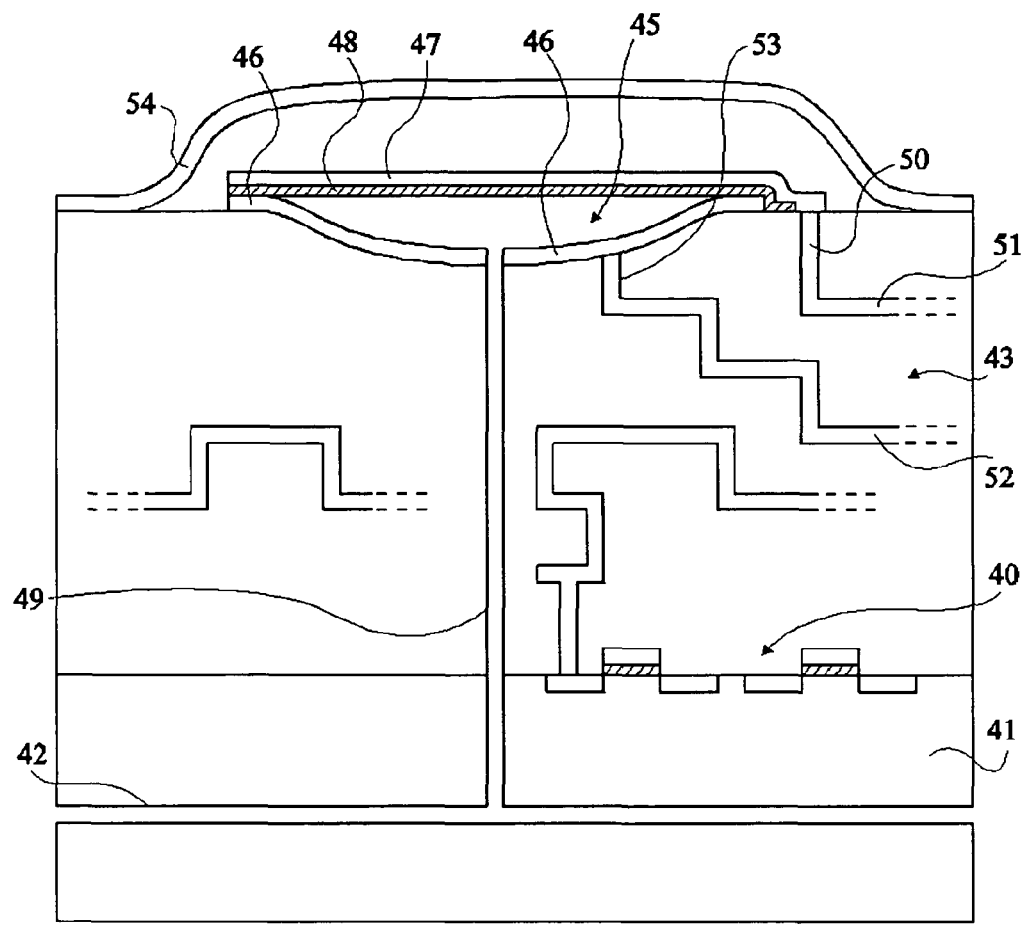
FIG. 7 is a cross-section view of an example of an integrated circuit comprising a pump according to the present invention.

FIG. 7 is a cross-section view of an example of an integrated circuit comprising a pump according to the present invention. Components 40, such as MOS transistors, are formed at the surface of a semiconductor substrate 41. A network of ventilating ducts 42 is provided in semiconductor substrate 41. A network of metal interconnects 43 is placed above components 40 and substrate 41. Interconnect network 43 comprises in this example five metallization levels on which are formed various conductive lines. Conductive vias enable connecting conductive lines placed on two adjacent levels. A micropump according to the present invention is placed in this example above interconnect network 43 and more specifically in a cup-shaped cavity 45 formed in the upper insulating layer of the last metallization level. A conductive layer 46 covers the inside and the border of cavity 45. A conductive layer 47, covered at its lower surface with an insulating layer 48, is placed above cavity 45 by bearing against the border. A vertical opening, corresponding to a duct 49, is formed through interconnect network 43. Duct 49 emerges on the one hand into cavity 45 of the pump through an opening of conductive layer 46 and on the other hand into ventilating duct 42 provided in semiconductor substrate 41. The pump is placed under a protection "bell" formed of an insulating portion 54 substantially having the shape of a hemisphere laid on interconnect network 43.

On one of the sides of cavity 45, insulating layer 48 extends to partially cover the upper insulating layer of interconnect network 43. Conductive layer 47 continues above the extension of insulating layer 48 to cover a portion of the upper insulating layer in which is placed a conductive via 50 connected to a conductive line 51 of interconnect network 43. Conductive layer 46 is connected to a conductive line 52 of the interconnect network via a conductive via 53 placed under conductive layer 46. Conductive lines 51 and 52 enable connecting conductive layers 46 and 47 to a control circuit V formed in the integrated circuit substrate.

Such an integrated circuit may comprise a temperature sensor. The control circuit may activate more or less rapidly the pump according to the measured temperature.

Other embodiments of an integrated circuit comprising a pump according to the present invention may be imagined. The pump may for example be placed right above semiconductor substrate 41 under interconnect network 43.

Of course, the present invention is likely to have various alterations, modifications, and improvements which will readily occur to those skilled in the art. In particular, those skilled in the art may imagine other methods for manufacturing a pump according to the present invention. Further, the number and the location of the openings formed in the lower conductive layer of the pump will be determined according to the ventilating ducts provided in the integrated circuit.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An integrated circuit chip comprising:
   a semiconductor substrate comprising at least one transistor; and
   a pump in fluid communication with a ventilating duct and configured to provide pressure sufficient to set a fluid in motion through the ventilating duct so as to cool the integrated circuit chip, the pump comprising:
   a cavity disposed on the semiconductor substrate;
   a conductive layer covering at least a portion of an interior of the cavity;
   a flexible membrane, including a conductive material, placed above the cavity;
   a dielectric layer that provides insulation between portions of the conductive layer and the conductive material of the flexible membrane which are close to each other;
   a pumping volume defined between the conductive layer and the flexible membrane;
   a first opening and a second opening, each opening disposed on the same side of the flexible membrane and providing fluid communication to the pumping volume through the conductive layer;
   terminals to receive and apply voltage between the conductive layer and the flexible membrane to cause the flexible membrane to move; and
   wherein the flexible membrane is constructed and arranged to cover at least one of the first opening and the second opening and produce the pressure sufficient to set a fluid in motion through the ventilating duct so as to cool the integrated chip upon application of the voltage.

2. The integrated circuit chip of claim 1, wherein the cavity has a cup shape so that an interval between the conductive layer and the membrane progressively increases from a border, formed between the cavity and an upper surface of the substrate, to a bottom of the cavity.

3. The integrated circuit chip of claim 1, wherein the first opening is positioned substantially at a bottom of the cavity.

4. The integrated circuit chip of claim 1, wherein the ventilating duct is formed at least partially in the semiconductor substrate of the integrated circuit and leads to the first opening.

5. The integrated circuit chip of claim 1, wherein the dielectric layer is disposed on the conductive layer.

6. The integrated circuit chip of claim 1, wherein the dielectric layer is disposed on the flexible membrane.

7. The integrated circuit chip of claim 1, wherein the flexible membrane comprises a conductive material.

8. The integrated circuit chip of claim 1, wherein the first opening and the second opening are constructed and arranged to cause fluid introduced into the pumping volume through the second opening to move in a direction predominantly from the second opening toward the first opening upon application of the voltage to the flexible membrane.

9. The integrated circuit chip of claim 1, wherein the ventilating duct comprises a first ventilating duct formed at least partially in the semiconductor substrate of the integrated circuit and that leads to the first opening and further comprising a second ventilating duct formed at least partially in the semiconductor substrate and that leads to the second opening.

10. The integrated circuit chip of claim 1, wherein application of the voltage to the terminals causes the flexible membrane to move toward the conductive layer to close fluid communication between the second opening and the pumping volume.

11. The integrated circuit chip of claim 1, wherein the flexible membrane is configured to cover at least the second opening when the voltage is applied.

12. The integrated circuit chip of claim 1, wherein the second opening is larger than the first opening to promote the introduction of more air through the second opening than the first opening to the pumping volume when the voltage is reduced.

13. An integrated circuit chip comprising:
a semiconductor substrate comprising at least one transistor; and
a pump in fluid communication with a ventilating duct and configured to provide pressure sufficient to set a fluid in motion through the ventilating duct so as to cool the integrated circuit chip, the pump comprising:
a cavity disposed on the semiconductor substrate;
a conductive layer covering at least a portion of an interior of the cavity;
a flexible membrane, including a conductive material, placed above the cavity;
a dielectric layer that provides insulation between portions of the conductive layer and the conductive material of the flexible membrane which are close to each other;
a pumping volume defined between the conductive layer and the flexible membrane;
a first opening and a second opening, each opening providing fluid communication to the pumping volume through the conductive layer and configured to set the fluid in a directional motion, wherein the second opening is positioned closer to a border of the cavity than the first opening is positioned to the border, the border being between the cavity and an upper surface of the substrate, and the first opening positioned closer to a center of the cavity than the second opening;
terminals to receive and apply voltage between the conductive layer and the flexible membrane to cause the flexible membrane to move; and
wherein the flexible membrane is configured to cover the at least one opening upon application of the voltage.

14. The integrated circuit chip of claim 13, wherein upon application of a sufficient voltage between the conductive layer and the membrane, the flexible membrane is adapted to deform in a motion toward the conductive layer so as to cover the second opening and not the first opening.

15. An integrated circuit chip comprising:
a semiconductor substrate comprising at least one transistor and at least one ventilating duct; and
a pump configured to provide pressure sufficient to set a fluid in motion through the at least one ventilating duct so as to cool the integrated circuit chip, the pump being disposed on the semiconductor substrate and in fluid communication with the at least one ventilating duct, the pump including a cavity disposed on the semiconductor substrate and a flexible membrane disposed on the cavity, wherein the cavity includes a first opening and a second opening, each opening disposed on the same side of the flexible membrane and providing fluid communication between the cavity and the at least one ventilating duct, wherein the flexible membrane is constructed and arranged to produce the pressure sufficient to cause fluid motion through the at least one ventilating duct so as to cool the integrated circuit chip upon actuation.

16. The integrated circuit chip of claim 15, wherein the pump comprises a conductive layer covering at least a portion of an interior of the cavity.

17. The integrated circuit chip of claim 16, wherein the first and second opening provides fluid communication between the at least one ventilating duct and the cavity through the conductive layer.

18. The integrated circuit chip of claim 15, wherein the flexible membrane includes a conductive material.

19. The integrated circuit chip of claim 18, wherein the pump comprises a dielectric layer that provides insulation between portions of a conductive layer and the conductive material of the flexible membrane, the conductive layer and the conductive material being in close proximity to one another.

20. The integrated circuit chip of claim 19, wherein the pump comprises terminals to receive and apply voltage between the conductive layer and the flexible membrane to cause the flexible membrane to move.

21. The integrated circuit chip of claim 20, wherein the flexible membrane is configured to cover at least one opening in the conductive layer that provides fluid communication between the cavity and the at least one ventilating duct upon application of the voltage.

22. The integrated circuit chip of claim 21, wherein the first opening and the second opening are constructed and arranged to cause fluid introduced into the pumping volume through the second opening to move in a direction predominantly from the second opening toward the first opening upon actuation of the flexible membrane.

* * * * *